(12) United States Patent

Kano et al.

(10) Patent No.: US 8,130,982 B2
(45) Date of Patent: Mar. 6, 2012

(54) SIGNAL AMPLIFYING APPARATUS, AMPLIFICATION SYSTEM, AND SIGNAL AMPLIFICATION METHOD

(75) Inventors: Masaya Kano, Hamamatsu (JP); Hironari Kawai, Hamamatsu (JP); Masao Noro, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 801 days.

(21) Appl. No.: 12/188,835

(22) Filed: Aug. 8, 2008

(65) Prior Publication Data

US 2009/0041268 A1 Feb. 12, 2009

(30) Foreign Application Priority Data

Aug. 9, 2007 (JP) .................................. 2007-208111

(51) Int. Cl.
*H03F 99/00* (2009.01)
(52) U.S. Cl. ........................................ 381/120; 330/250
(58) Field of Classification Search .................. 381/120; 330/250
See application file for complete search history.

(56) References Cited

U.S. PATENT DOCUMENTS

2002/0051546 A1* 5/2002 Bizjak ........................... 381/106

FOREIGN PATENT DOCUMENTS

| JP | A 56-156005 | 12/1981 |
| JP | A 2002-290247 | 10/2002 |
| JP | 2004-104649 A | 4/2004 |
| JP | A-2007-174349 | 7/2007 |

OTHER PUBLICATIONS

Japanese Office Action issued Apr. 23, 2011 (2 pgs.) and English translation thereof (2 pgs.).

* cited by examiner

*Primary Examiner* — Steven J Fulk
(74) *Attorney, Agent, or Firm* — Crowell & Moring LLP

(57) ABSTRACT

An amplification system of the invention can decrease power consumption in a power amplification section if the power amplification section need not be used. The power consumption in the power amplification section can be decreased by shutting off power feed into a voltage amplification stage by a power control section, and the power feed state into a power amplification stage from a power supply section is not changed. Thus, power feed into the voltage amplification stage of the circuit wherein a large current does not flow needs only to be controlled using limiter means also used for a different application, so that the power consumption of the power amplification section can be decreased without the need for enlarging the circuit scale, with saved space, and simply.

7 Claims, 3 Drawing Sheets

A. STANDBY SIGNAL
B. STANDBY PERIOD SIGNAL
C. VOLTAGE CONTROL SIGNAL
D. LEVEL SIGNAL

3 PREAMPLIFICATION SECTION
10 POWER SUPPLY SECTION
11 VOLTAGE ADJUSTMENT SECTION
12 VOLTAGE CONTROL SECTION
13 STANDBY SIGNAL ACQUISITION SECTION
14 OUTPUT LEVEL DETECTION SECTION
15 CONTROL SIGNAL OUTPUT SECTION
16 VOLTAGE VALUE DETERMINATION SECTION
17 PREAMPLIFICATION OUTPUT SECTION
41 VOLTAGE AMPLIFICATION STAGE
42 POWER AMPLIFICATION STAGE

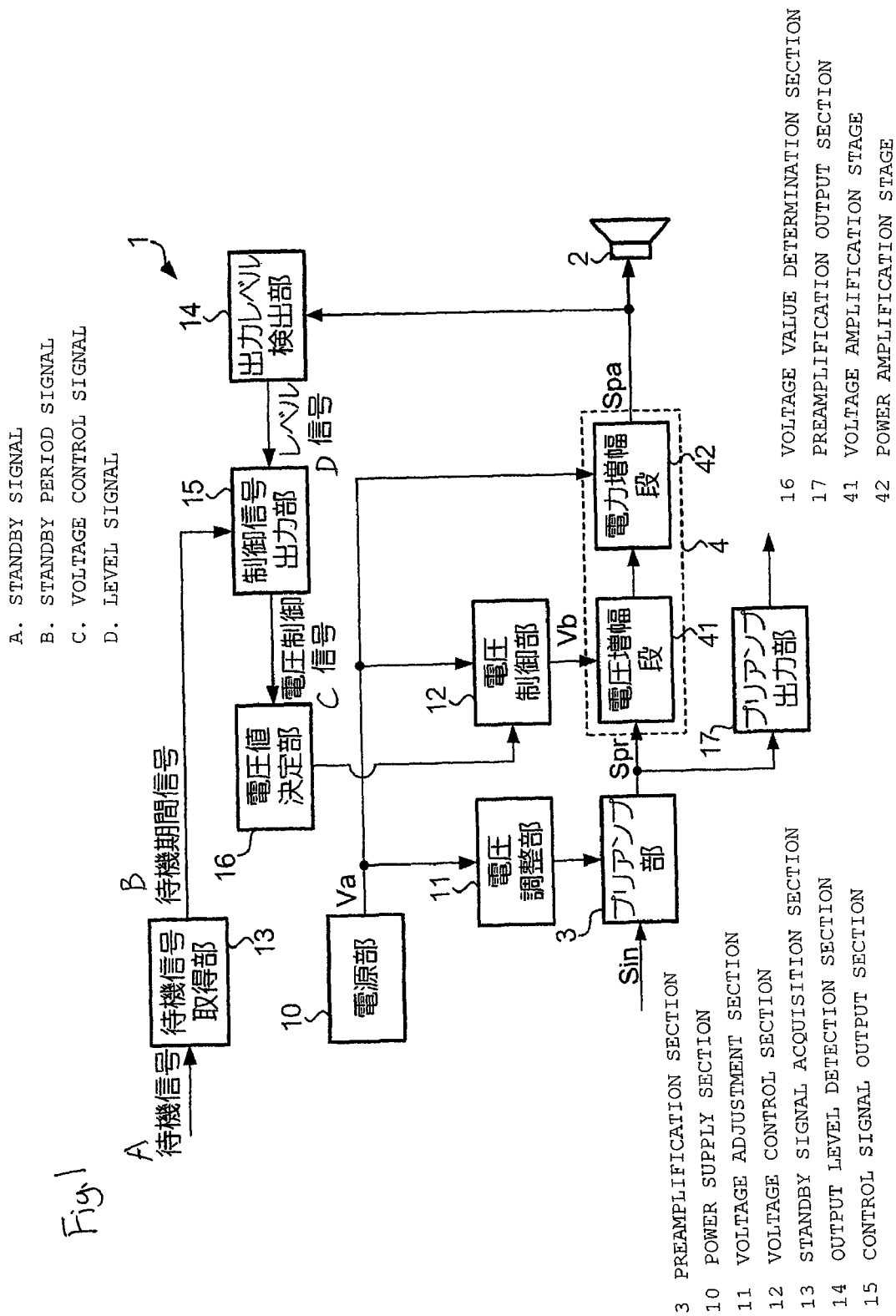

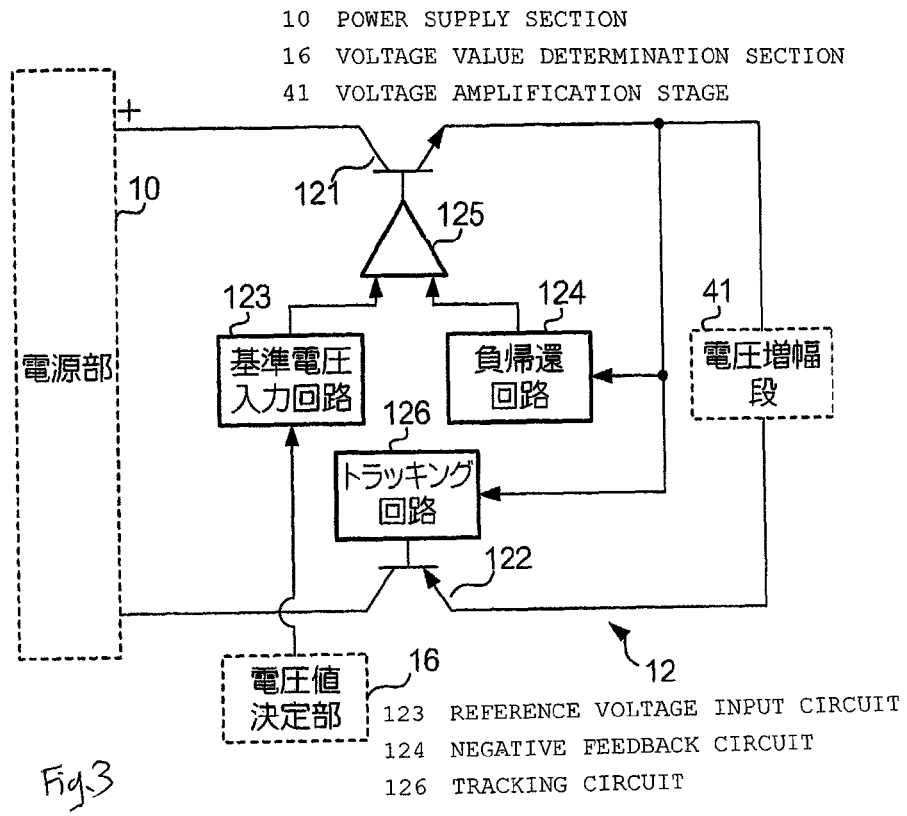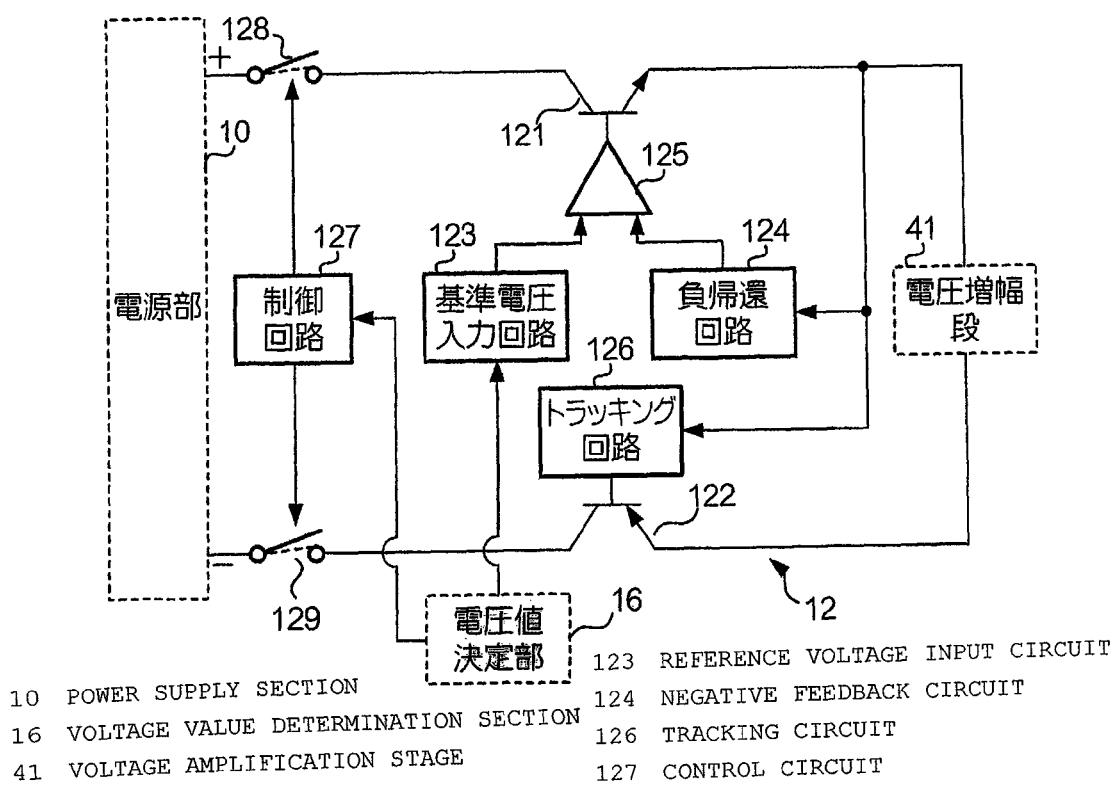

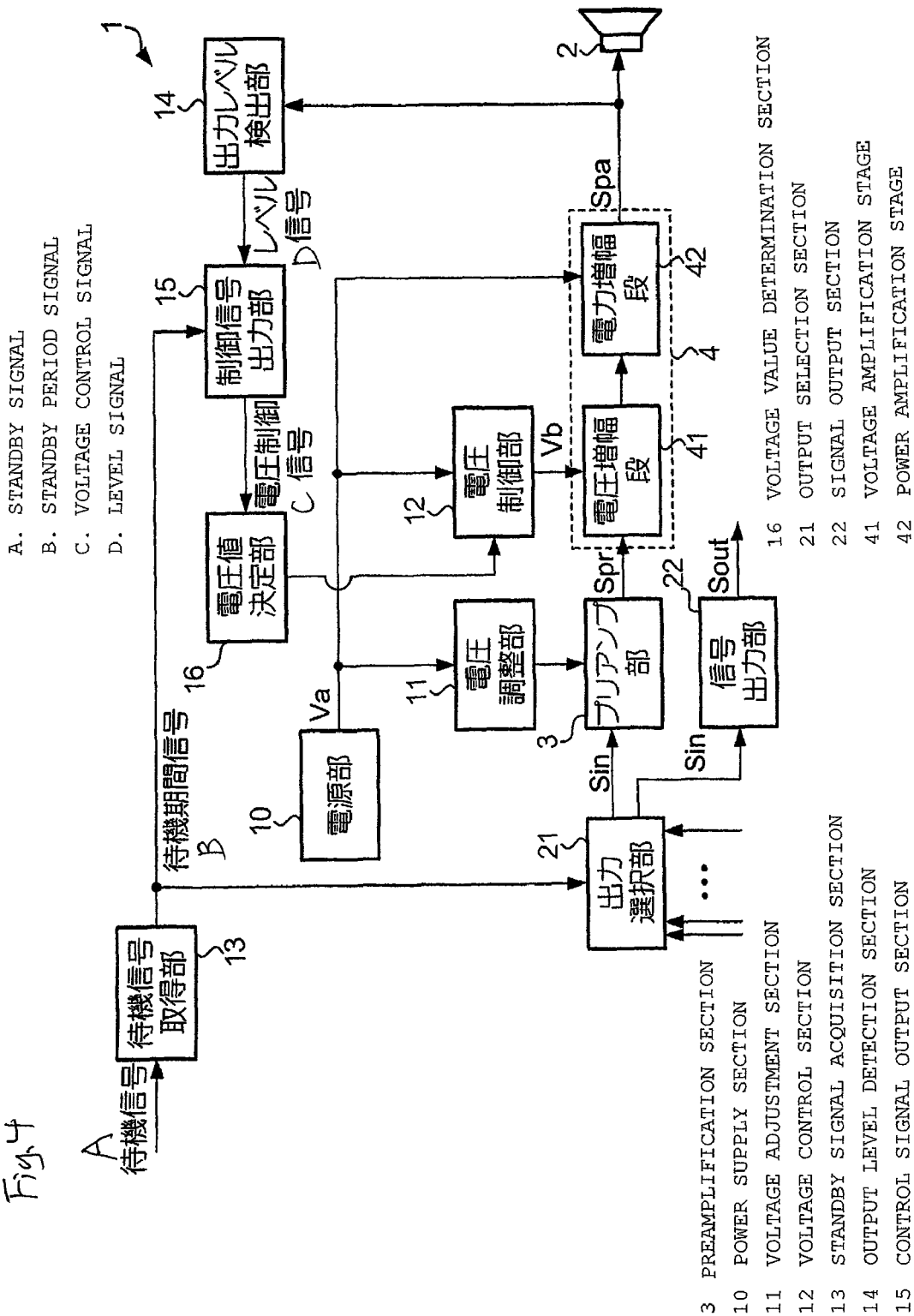

SIGNAL AMPLIFYING APPARATUS, AMPLIFICATION SYSTEM, AND SIGNAL AMPLIFICATION METHOD

BACKGROUND OF THE INVENTION

This invention relates to an art of decreasing power consumption of a power amplifier.

An amplification system for amplifying an audio signal amplifies a signal whose output level is small by a preamplifier and amplifies the signal amplified to a predetermined level by a power amplifier, thereby providing large output. Usually, the power amplifier mainly executes amplification of a signal to a level required for providing large output, and the preamplifier amplifies an audio signal to an input level required for the power amplifier and also executes sound field addition, tone control, volume control, etc.

On the other hand, the user who uses such an amplification system may not require large output using the power amplifier and may need only to obtain output from different loudspeakers using output from the preamplifier; the power amplifier involves large power consumption because of the characteristic of the power amplifier and there is a demand for stopping the function of the power amplifier and decreasing power consumption when the power amplifier is not used. To thus stop the function of the power amplifier, an art of turning off power supplied to the power amplifier is available. (For example, refer to JP-A-2004-104649)

However, to turn off the power supplied to the power amplifier as in the art disclosed in JP-A-2004-104649, a large load is imposed on a relay contact because of the magnitude of the supplied power and thus the reliability is degraded. On the other hand, if a relay is used upstream from a transformer to attempt to control at a stage before the supplied power becomes large, it is necessary to use a transformer for each of the preamplifier and the power amplifier and a very large space is required.

SUMMARY OF THE INVENTION

It is therefore an object of the invention to provide a signal amplifying apparatus, an amplification system, and a signal amplification method capable of easily decreasing power consumption of a power amplifier when the power amplifier need not be used.

To achieve the above object, the present invention provides the following arrangements.

(1) A signal amplifying apparatus comprising:
a voltage amplifier that amplifies voltage of an input audio signal, outputs the amplified audio signal and limits the maximum amplitude of the output signal based on power feed voltage;
a power amplifier that amplifies power of the audio signal subjected to the voltage amplification by the voltage amplifier;
a power supply that feeds power into the voltage amplifier and the power amplifier;
a control signal generator that generates a voltage control signal indicating magnitude of voltage;
a voltage value determination unit that determines a voltage value based on the voltage control signal generated by the control signal generator and if the voltage control signal indicates a predetermined value, determines the voltage value to be a non-drive value at which the voltage amplifier enters a non-drive state; and
a voltage controller that controls the power feed voltage fed into the voltage amplifier from the power supply so as to be the voltage value determined by the voltage value determination unit by lowering the power feed voltage.

(2) The signal amplifying apparatus according to (1) further comprising:
an output level detector that detects the output level of the audio signal whose power is amplified by the power amplifier; and
a standby signal acquisition unit that acquires a standby signal indicating whether or not a state of the signal amplifier is a standby state,
wherein the control signal generator generates the voltage control signal indicating the predetermined value if the standby signal acquired by the standby signal acquisition unit indicates the standby state; otherwise, generates the voltage control signal indicating a value based on the output level detected by the output level detector.

(3) The signal amplifying apparatus according to (2) further comprising a receiver that receives the standby signal by conducting communications with an external machine, wherein the standby signal acquisition unit acquires the standby signal received by the receiver.

(4) The signal amplifying apparatus according to (1) further comprising shut off unit for shutting off power feed into the voltage amplifier from the power supply if the voltage control signal generated by the control signal generator indicates the predetermined value.

(5) An amplification system comprising:
the signal amplifying apparatus according to (1);
a preamplification section that amplifies and outputs an input audio signal;
a first output section that outputs the audio signal output by the power amplifier to a terminal to which a loudspeaker is connected; and
a second output section that outputs the audio signal output from the preamplification section to an external system,
wherein the audio signal input to the voltage amplifier is the audio signal output from the preamplification section.

(6) An amplification system comprising:
the signal amplifying apparatus according to (1);
an audio signal input section having a plurality of input terminals to which audio signals are input; and
an output selection section that supplies the audio signal input to the preset one of the input terminals of the audio signal input section to an output terminal to which an external machine is connected if the voltage control signal generated by the control signal generator indicates the predetermined value; otherwise, outputs an audio signal input to any of the input terminals of the audio signal input section to a path connected to the voltage amplifier.

(7) A signal amplification method used with a signal amplifying apparatus comprising a voltage amplifier that amplifies voltage of an input audio signal, outputs the amplified audio signal and limits the maximum amplitude of the output signal based on power feed voltage; a power amplifier that amplifies power of the audio signal subjected to the voltage amplification by the voltage amplifier; and a power supply that feeds power into the voltage amplifier and the power amplifier, the method comprising:
generating a voltage control signal indicating the magnitude of voltage;
determining a voltage value based on the generated voltage control signal;
determining the voltage value to be a non-drive value at which the voltage amplifier enters a non-drive state if the voltage control signal indicates a predetermined value; and controlling the power feed voltage fed into the voltage amplifier from the power supply so as to be the determined voltage value by lowering the power feed voltage.

According to the invention, there can be provided a signal amplifying apparatus, an amplification system, and a signal amplification method capable of easily decreasing power consumption of a power amplifier when the power amplifier need not be used.

BRIEF DESCRIPTION OF THE DRAWINGS

FIG. 1 is a block diagram to show the configuration of an amplification system according to an embodiment of the invention;

FIG. 2 is a block diagram to show the configuration of a power control section according to the embodiment of the invention;

FIG. 3 is a block diagram to show the configuration of a power control section according to modified example 1; and FIG. 4 is a block diagram to show the configuration of an amplification system according to modified example 5.

DETAILED DESCRIPTION OF PREFERRED EMBODIMENTS

One embodiment of the invention will be discussed.
<Embodiment>

An amplification system 1 according to the embodiment of the invention performs acoustic treatment of sound field addition, tone control, volume control, etc., for an input audio signal Sin and supplies an audio signal Spa subjected to amplification processing to a loudspeaker 2 connected to an output terminal of the amplification system 1 and outputs an audio signal Spr from a preamplification output section 17. The loudspeaker 2 is sound output means for outputting sound of the input audio signal Spa. The configuration of the amplification system 1 will be discussed with FIG. 1. FIG. 1 is a block diagram to show the configuration of the amplification system 1 to which the loudspeaker 2 is connected.

A preamplification section 3 has a DSP (Digital Signal Processor) for performing acoustic treatment of sound field addition, tone control, volume control, etc., for an input audio signal Sin and an amplification circuit for performing amplification processing. This amplification processing is performed to ensure the input level required in a power amplification section 4 described later. The audio signal Sin is subjected to acoustic treatment and amplification processing by the preamplification section 3 and is output as an audio signal Spr.

Power is fed into the preamplification section 3 through a voltage adjustment section 11 from a power supply section 10. The voltage adjustment section 11 lowers a voltage value Va involved in the power feed from the power supply section to a voltage value required for each part of the preamplification section 3 and feeds power.

The power amplification section 4 has a voltage amplification stage 41 and a power amplification stage 42. Power is fed into the voltage amplification stage 41 through a power control section 12 from the power supply section 10, and power is fed into the power amplification stage 42 from the power supply section 10. The power control section 12 is limiter control means for lowering the voltage value Va involved in the power feed from the power supply section 10 to a voltage value Vb specified from a voltage value determination section 16 described later (usually, the voltage value ranges from 0 V to Va) and feeding power into the voltage amplification stage 41.

A configuration example of the power control section 12 will be discussed with FIG. 2. The power control section 12 controls the voltage value Va involved in the power feed from the power supply section 10 by an npn transistor 121 and a pnp transistor 122 and supplies power to the voltage amplification stage 41. A reference voltage input circuit 123 outputs a reference voltage responsive to the voltage value Vb specified from the voltage value determination section 16 to a comparator 125. A negative feedback circuit 124 is a circuit for negatively feeding back output of an emitter of the npn transistor 121, namely, the voltage value of + voltage application to the voltage amplification stage 41 into the comparator 125 and inputting the voltage value responsive to the voltage value of the + voltage applied to the voltage amplification stage 41 into the comparator 125. Based on comparison between the voltage value input from the reference voltage input circuit 123 and the voltage value input from the negative feedback circuit 124, the comparator 125 controls the base current of the npn transistor so that both the voltage values match. In the embodiment, the npn transistor 121 and the pnp transistor 122 are used, but the transistor to be used can be changed in response to the circuit implementing the power control section 12.

A tracking circuit 126 acquires output of the emitter of the npn transistor 121, namely, the voltage value of + voltage application to the voltage amplification stage 41, executes tracking adjustment based on the voltage value, and controls the base current of the pnp transistor, thereby controlling the voltage applied to the voltage amplification stage 41 so that the voltage value of the voltage applied to the voltage amplification stage 41 becomes Vb.

Specifically, if voltage of voltage value "+Va/2" is applied to a + terminal of the power supply section 10 and voltage of voltage value "−Va/2" is applied to a − terminal, voltage of voltage value "+Vb/2" is applied to a + terminal of the voltage amplification stage 41 and voltage of voltage value "−Vb/2" is applied to a − terminal. In this case, the reference voltage input circuit 123, for example, converts the specified value "Vb" from the voltage value determination section 16 into "+Vb/2" of a half value and inputs it to the comparator 125. On the other hand, the negative feedback circuit 124 inputs the voltage value "+Vb/2" of + voltage application to the voltage amplification stage 41 to the comparator 125 as it is. The comparator 125 controls the base current of the npn transistor so that the output voltage of the emitter becomes the reference voltage "+Vb/2." The tracking circuit 126 controls the base current so that the output voltage of the emitter of the pnp transistor 122 becomes "−Vb/2" provided by inverting the voltage value "+Vb/2" of + voltage application to the voltage amplification stage 41. Thus, the power control section 12 lowers the voltage value Va involved in the power feed from the power supply section 10 to the voltage value Vb specified from the voltage value determination section 16 and feeds power.

Referring again to FIG. 1, the voltage amplification stage 41 is an amplification circuit for executing voltage amplification of the audio signal Spr output from the preamplification section 3 and outputting the amplified signal to the power amplification stage 42 and has limiter means for limiting the maximum amplitude of the output signal in response to the voltage value Vb. The voltage amplification stage 41 is a circuit wherein the input/output impedance is high and usually current is about several hundred milliamperes and a large current does not flow.

The power amplification stage 42 is an amplification circuit for executing power amplification of the audio signal output from the voltage amplification stage 41 and outputting the amplified signal as an audio signal Spa to the output terminal to which the loudspeaker 2 is connected. In the power amplification stage 42, the input impedance is high and the output impedance is low. The power amplification stage 42 consumes the current responsive to the voltage of the input audio signal and if the voltage of the input audio signal is large, the power amplification stage 42 consumes a large current of about 10 A at the maximum; if the voltage of the input audio signal lessens, the consumption current lessens. Thus, if the maximum amplitude of the signal output from the voltage amplification stage 41 is large, namely, if Vb is close to Va, most of the power in the amplification system is consumed in the power amplification stage 42.

Further, if the input audio signal is a silent state, idling current flowing into the voltage amplification stage 41 and the power amplification stage 42 exists about several milliamperes to several hundred milliamperes and thus the power consumption is large. Particularly, for an amplification system of an AV receiver with a large number of output channels, etc., a large number of power amplification sections 4 also become necessary and consequently the power consumption increases even at the silent time. For example, if current of 10 milliamperes is in the voltage amplification stage 41 and current of 50 milliamperes is in the power amplification stage 42 and the power supply voltage is ±60 V per channel, the power consumption becomes 7.2 W per channel and if 10 channels exist, the power consumption becomes no less than 72 W even at the silent time. If the voltage of the power fed into the voltage amplification stage 41 is lowered by the power control section 12 and a non-drive state is entered as described later, the idling current of the voltage amplification stage 41 disappears and the whole power consumption of the power amplification section 4 is decreased.

A standby signal acquisition section 13 acquires a standby signal indicating whether or not the state is a standby state, and outputs a standby period signal indicating the period of the standby state to a control signal output section 15. The standby period signal indicating the period of the standby state may be a step signal indicating the standby state when the signal is "0" and any other state (which will be hereinafter called usual state) when the signal is "1" or may be a pulse signal only at the switching timing between the standby state and the usual state; it may be any signal if the period of the standby state can be determined. For the standby signal indicating the standby state or the usual state, the user may set the standby state or the usual state by operating operation means (not shown), and the operation means may output a standby signal indicating the setup state.

An output level detection section 14 detects the output level of the audio signal Spa output from the power amplification section 4 and outputs a level signal indicating the average level of the detected output levels to the control signal output section 15.

The control signal output section 15 generates a voltage control signal of a value indicating the magnitude of voltage based on the standby period signal output from the standby signal acquisition section 13 and the level signal output from the output level detection section 14, and outputs the voltage control signal to the voltage value determination section 16. Specifically, if the state determined based on the standby period signal is the standby state, the control signal output section 15 generates a voltage control signal indicating a predetermined value (in the embodiment "0"). On the other hand, if the state is the usual state, the control signal output section 15 generates a voltage control signal indicating the value responsive to the average level indicated by the level signal. Setting is made so that the value indicated by the voltage control signal lessens, namely, the magnitude of the voltage lessens if the average level becomes a given level or more.

The voltage value determination section 16 determines the voltage value Vb based on the voltage control signal output from the control signal output section 15 and controls the power control section 12 so that the voltage of the power fed into the voltage amplification stage 41 becomes the determined voltage value Vb as described above. At this time, if the voltage control signal indicates the predetermined value "0," the voltage value determination section 16 determines the voltage value Vb to be 0 V and consequently causes the power control section 12 to shut off the power feed into the voltage amplification stage 41. The voltage value Vb need not necessarily be 0 V if it is a voltage value (non-drive value) at which the voltage amplification stage 41 enters a non-drive state.

On the other hand, if the voltage control signal output from the control signal output section 15 is any other than the predetermined value "0," the voltage value determination section 16 determines the voltage value Vb based on that value and causes the power control section 12 to apply voltage of the voltage value Vb to the voltage amplification stage 41. For example, the value indicated by the voltage control signal may be adopted as the voltage value Vb or if the value indicated by the voltage control signal indicates a value between 0 and 1, the value calculated as the ratio to the voltage value Va may be adopted as the voltage value Vb. Thus, feeding back responsive to the output level of the audio signal Spa is performed for controlling the voltage value Vb, whereby too large load imposed on the power amplification section 4, the loudspeaker 2, etc., as the output level becomes too large can be prevented and the power control section 12 has a function as limiter control means for controlling the limiter means of the voltage amplification stage 41.

The preamplification output section 17 supplies the audio signal Spr output from the preamplification section 3 to a preamplification output terminal to which an external machine is connected. The preamplification output section 17 may acquire a standby period signal from the standby signal acquisition section 13 and if the state determined by the standby period signal is the standby state, the preamplification output section 17 may supply the audio signal Spr to the preamplification output terminal; if the state is the usual state, the preamplification output section 17 may stop supplying the audio signal Spr to the preamplification output terminal. A control signal output terminal may be provided for outputting a control signal for controlling power of a connected external machine in response to the state determined by the standby period signal.

Next, the operation of the amplification system 1 is as follows: It is assumed that the state indicated by the standby signal is the usual state.

In the usual state, the input audio signal Sin is subjected to acoustic treatment and amplification processing in the preamplification section 3 and further the audio signal Spa subjected to amplification processing in the power amplification section 4 is supplied to the loudspeaker 2. Accordingly, the user can listen to sound of large output amplified in the power amplification section 4.

If the user need not output sound of the audio signal Spa subjected to amplification processing in the power amplification section 4 from the loudspeaker 2, the user operates the operation means to switch to the standby state. Accordingly, the state indicated by the standby signal becomes the standby state and the power control section 12 lowers the power feed voltage applied to the voltage amplification stage 41 so as to place the voltage amplification stage 41 in a non-drive state, and power feed into the voltage amplification stage 41 is shut off. Accordingly, the power consumption in the power amplification section 4 which need not perform amplification processing decreases. On the other hand, the preamplification output section 17 continues supplying the audio signal Spr to the external machine regardless of the usual state or the standby state. Accordingly, the user can listen to sound output of the audio signal Spr subjected to acoustic treatment and amplification processing in the preamplification section 3 from the external machine connected to the preamplification output terminal of the preamplification output section 17.

Thus, if it is not necessary to output sound of the audio signal Spa subjected to amplification processing in the power amplification section 4 from the loudspeaker 2, the amplification system 1 can supply low-output, but high-quality audio signal Spr output from the preamplification section 3 to the external machine and can also decrease the power consumption in the power amplification section 4 which need not perform amplification processing. The power consumption in the power amplification section 4 can be decreased by shutting off power feed into the voltage amplification stage 41 by the power control section 12, namely, using the limiter means, and the power feed state into the power amplification stage 42 from the power supply section 10 is not changed. Thus, power feed into the voltage amplification stage 41 of the circuit wherein a large current does not flow needs only to be controlled using the limiter means also used for a different application, so that the power consumption of the power amplification section 4 can be decreased without the need for enlarging the circuit scale, with saved space, and simply.

While the embodiment of the invention has been described, the invention can be embodied in the following various forms:

MODIFIED EXAMPLE 1

The power control section 12 in the embodiment described above may be provided with shut off means for shutting off power feed into the voltage amplification stage 41 from the power supply section 10 in addition to the function of the limiter means. In this case, for example, a configuration as shown in FIG. 3 may be adopted. If the voltage control signal generated by the control signal output section 15 is the predetermined value "0" and the voltage value Vb of the specified value from the voltage value determination section 16 is 0 V, a control circuit 127 may control switches 128 and 129 to an OFF state, thereby shutting off power feed from the power supply section 10; otherwise, the control circuit 127 may control the switches 128 and 129 to an ON state for allowing power feed from the power supply section 10.

The switches 128 and 129 can use relays, transistors, etc., and the control circuit 127 may perform switching processing of the switch 128, 129 between the ON state and the OFF state in response to the type of switch 128, 129. In so doing, power feed into the voltage amplification stage 41 from the power supply section 10 can be shut off, so that the voltage applied to the voltage amplification stage 41 can be reliably set to 0 V and the power consumption of the power amplification section 4 can be decreased. In the configuration shown in FIG. 3, the switch 128 is provided between an npn transistor 121 and a terminal of the power supply section 10 and the switch 129 is provided between a pnp transistor 122 and a terminal of the power supply section 10, but the switch 128 may be provided between the npn transistor 121 and the voltage amplification stage 41 and the switch 129 may be provided between the pnp transistor 122 and the voltage amplification stage 41.

MODIFIED EXAMPLE 2

In the embodiment described above, the power control section 12 is the limiter means for changing the voltage value involved in the power feed into the voltage amplification stage 41 in response to the output level of the audio signal Spa output from the power amplification section 4, but may be voltage control means that can control the voltage value independently of the output level. In this case, for example, operation means for setting a voltage value may be provided and in place of the control signal output section 15, the operation means may generate a voltage control signal in response to the voltage value set by the user operating the operation means and may output the voltage control signal to the voltage value determination section 16. The user operates the operation means so as to set a voltage value at which the voltage amplification stage 41 enters a non-drive state, whereby the voltage value involved in the power feed into the voltage amplification stage 41 can be controlled for suppressing the power consumption of the power amplification section 4 as with the power control section 12 in the embodiment.

MODIFIED EXAMPLE 3

In the embodiment described above, for example, the user operates the operation means to set the standby state or the usual state and the operation means outputs a standby signal indicating the setup state, but the standby state or the usual state may be able to be set from a communication apparatus that can communicate with the amplification system 1 through a network, etc. In this case, the amplification system 1 may be provided with communication means that can communicate with the communication apparatus through the network. The communication means may generate a standby signal responsive to the standby state or the usual state set from the communication apparatus for communicating with the amplification system 1 through the network and the standby signal acquisition section 13 may acquire the standby signal. Thus, the communication apparatus that can communicate with the amplification system 1 may switch between the standby state and the usual state to control the power consumption of the power amplification section 4. A method of using HDMICEC (High-Definition Multimedia Interface Consumer Electronics Control), RS-232C, etc., is available as communications other than the network.

MODIFIED EXAMPLE 4

In the embodiment described above, it is assumed that the amplification system 1 has one power amplification section 4, but the amplification system 1 may have a plurality of power amplification sections 4 and a plurality of loudspeakers 2, wherein the loudspeakers 2 are in a one-to-one correspondence with the power amplification sections 4 and sound output of each of the power amplification sections 4 is produced from the corresponding loudspeaker 2. In this case, the power control section 12 may be able to control the voltage value involved in the power feed into the voltage amplification stage 41 of each of the power amplification sections 4 separately. To identify the power amplification section 4 involving the voltage amplification stage 41 to control the voltage value thereof, identification information determining each of the power amplification sections 4 may be superposed on a standby signal, a standby period signal, and a voltage control signal, and the voltage value determination section 16 may control the power control section 12 based on the identification information to control the voltage value of the voltage amplification stage 41 of the power amplification section 4. In so doing, if a plurality of power amplification sections 4 exist, power consumption can be controlled for each of the power amplification sections 4.

MODIFIED EXAMPLE 5

In the embodiment described above, the audio signal Spr output from the preamplification section 3 is supplied to the loudspeaker 2 in the standby state, namely, when the power consumption of the power amplification section 4 is decreased. However, in the standby state, the audio signal may be output to an external machine. In this case, the amplification system 1 may have a configuration as shown in FIG. 4. The configuration shown in FIG. 4 will be discussed below:

In the configuration shown in FIG. 4, the preamplification output section 17 is deleted from the configuration in the embodiment and an output selection section 21 and a signal output section 22 are provided. Therefore, the output selection section 21 and the signal output section 22 will be discussed and other components will not be discussed again.

The output selection section 21 has a plurality of input terminals to which an audio signal is input. The output selection section 21 selects any input terminal in response to operation of the operation means by the user selecting the input terminal and outputs an audio signal input to the selected input terminal to the preamplification section 3 or the signal output section 22 as an audio signal Sin. The output selection section 21 acquires a standby period signal output by the standby signal acquisition section 13. If the state determined based on the standby period signal is the standby state, the output selection section 21 automatically selects a preset input terminal and outputs an audio signal input to the input terminal to the signal output section 22 as an audio signal Sin.

The signal output section 22 has an output terminal for supplying an audio signal to an external machine. It outputs the audio signal Sin input from the output selection section 21 to the external machine connected to the output terminal as an audio signal Sout. In so doing, the audio signal input to the preset specific input terminal can be automatically output to the external machine in the standby state, namely, when the power consumption of the power amplification section 4 is decreased. For example, HDMI input to the output selection section 21 can be output from the signal output section 22 as HDMI output as it is.

If the preset specific input terminal is set as an input terminal to which an audio signal not subjected to amplification processing in the preamplification section 3 or the power amplification section 4, the audio signal that the user frequently listens to from the external machine is supplied, as the user simply operates the operation means to set the standby state, the power consumption of the power amplification section 4 can be decreased and the audio signal can be output to the external machine and sound output from the external machine can be switched to. When the audio signal is output to the external machine, the function of the preamplification section 3 through which the audio signal does not pass is not required and therefore the voltage adjustment section 11 may control so as to decrease the power consumption of the preamplification section 3. The preamplification output section 17 in the embodiment may be included in the configuration of the modified example. In this case, however, control of the voltage adjustment section 11 to decrease the power consumption of the preamplification section 3 and change of the power feed state are not performed. The user may be able to specify whether or not the preamplification section 3 is thus to be applied by operating the operation means, etc., and a signal indicating the specification may be output to the voltage adjustment section 11, which may then control the power feed state into the preamplification section 3 based on the signal indicating the specification.

What is claimed is:

1. A signal amplifying apparatus comprising:
   a voltage amplifier that amplifies voltage of an input audio signal, outputs the amplified audio signal and limits the maximum amplitude of the output signal based on power feed voltage;
   a power amplifier that amplifies power of the audio signal subjected to the voltage amplification by the voltage amplifier;
   a power supply that feeds power into the voltage amplifier and the power amplifier;
   a control signal generator that generates a voltage control signal indicating magnitude of voltage;
   a voltage value determination unit that determines a voltage value based on the voltage control signal generated by the control signal generator and if the voltage control signal indicates a predetermined value, determines the voltage value to be a non-drive value at which the voltage amplifier enters a non-drive state; and
   a voltage controller that controls the power feed voltage fed into the voltage amplifier from the power supply so as to be the voltage value determined by the voltage value determination unit by lowering the power feed voltage.

2. The signal amplifying apparatus according to claim 1 further comprising:
   an output level detector that detects the output level of the audio signal whose power is amplified by the power amplifier; and
   a standby signal acquisition unit that acquires a standby signal indicating whether or not a state of the signal amplifier is a standby state,
   wherein the control signal generator generates the voltage control signal indicating the predetermined value if the standby signal acquired by the standby signal acquisition unit indicates the standby state; otherwise, generates the voltage control signal indicating a value based on the output level detected by the output level detector.

3. The signal amplifying apparatus according to claim 2 further comprising a receiver that receives the standby signal by conducting communications with an external machine, wherein the standby signal acquisition unit acquires the standby signal received by the receiver.

4. The signal amplifying apparatus according to claim 1 further comprising shut off unit for shutting off power feed into the voltage amplifier from the power supply if the voltage control signal generated by the control signal generator indicates the predetermined value.

5. An amplification system comprising:
   the signal amplifying apparatus according to claim 1;
   a preamplification section that amplifies and outputs an input audio signal;
   a first output section that outputs the audio signal output by the power amplifier to a terminal to which a loudspeaker is connected; and
   a second output section that outputs the audio signal output from the preamplification section to an external system,
   wherein the audio signal input to the voltage amplifier is the audio signal output from the preamplification section.

6. An amplification system comprising:
   the signal amplifying apparatus according to claim 1;
   an audio signal input section having a plurality of input terminals to which audio signals are input; and an output selection section that supplies the audio signal input to the preset one of the input terminals of the audio signal input section to an output terminal to which an external machine is connected if the voltage control signal generated by the control signal generator indicates the predetermined value; otherwise, outputs an audio signal input to any of the input terminals of the audio signal input section to a path connected to the voltage amplifier.

7. A signal amplification method used with a signal amplifying apparatus comprising a voltage amplifier that amplifies voltage of an input audio signal, outputs the amplified audio signal and limits the maximum amplitude of the output signal based on power feed voltage; a power amplifier that amplifies power of the audio signal subjected to the voltage amplification by the voltage amplifier; and a power supply that feeds power into the voltage amplifier and the power amplifier, the method comprising:

generating a voltage control signal indicating the magnitude of voltage;

determining a voltage value based on the generated voltage control signal;

determining the voltage value to be a non-drive value at which the voltage amplifier enters a non-drive state if the voltage control signal indicates a predetermined value; and controlling the power feed voltage fed into the voltage amplifier from the power supply so as to be the determined voltage value by lowering the power feed voltage.

* * * * *